United States Patent
Park et al.

(10) Patent No.: US 11,490,039 B2
(45) Date of Patent: Nov. 1, 2022

(54) IMAGE SENSORS

(71) Applicant: Samsung Electronics Co., Ltd., Suwon-si (KR)

(72) Inventors: Jueun Park, Seongnam-si (KR);
Jungbin Yun, Hwaseong-si (KR);
Kyungho Lee, Suwon-si (KR);
Sanghyuck Moon, Suwon-si (KR);
Hongsuk Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/470,302

(22) Filed: Sep. 9, 2021

(65) Prior Publication Data
US 2022/0210348 A1    Jun. 30, 2022

(30) Foreign Application Priority Data
Dec. 29, 2020   (KR) .................. 10-2020-0186777

(51) Int. Cl.
| | |
|---|---|
| *H04N 5/3745* | (2011.01) |
| *H04N 5/369* | (2011.01) |
| *H04N 5/353* | (2011.01) |

(52) U.S. Cl.
CPC ........ *H04N 5/353* (2013.01); *H04N 5/37455* (2013.01); *H04N 5/379* (2018.08)

(58) Field of Classification Search
None
See application file for complete search history.

(56) References Cited

U.S. PATENT DOCUMENTS

| | | | |
|---|---|---|---|
| 7,982,837 B2 | 7/2011 | Kawasaki | |
| 9,282,633 B2 | 3/2016 | Zheng et al. | |
| 10,283,069 B2 | 5/2019 | Huang et al. | |
| 10,481,729 B2 | 11/2019 | Park | |
| 10,522,573 B2 | 12/2019 | Uchida et al. | |
| 10,579,833 B1 * | 3/2020 | Cook .................... | G06F 21/86 |
| 2019/0305026 A1 | 10/2019 | Tsao et al. | |

FOREIGN PATENT DOCUMENTS

KR       10-0585005 B1    5/2006

\* cited by examiner

*Primary Examiner* — Mark T Monk
(74) *Attorney, Agent, or Firm* — Harness, Dickey & Pierce, P.L.C.

(57) ABSTRACT

An image sensor includes first conductive patterns on a first surface of a substrate, and second conductive patterns between the first conductive patterns and the first surface, in which at least one of the first conductive patterns or the second conductive patterns includes a time constant adjustment pattern and neighboring conductive patterns, in which the time constant adjustment pattern extends in a first direction that is parallel to the first surface and the neighboring conductive patterns extend in the first direction and are most adjacent to the time constant adjustment pattern. The time constant adjustment pattern includes one or more time constant adjustment portions that protrude in a second direction that is parallel to the first surface and is perpendicular to the first direction, and the one or more time constant adjustment portions do not overlap the neighboring conductive patterns in the second direction.

20 Claims, 10 Drawing Sheets

IMAGE SENSORS

CROSS-REFERENCE TO RELATED APPLICATION

This application is based on and claims priority under 35 U.S.C. § 119 to Korean Patent Application No. 10-2020-0186777, filed on Dec. 29, 2020, in the Korean Intellectual Property Office, the disclosure of which is incorporated by reference herein in its entirety.

BACKGROUND

The inventive concepts relate to image sensors.

An image sensor, which is a semiconductor-based sensor that receives light (e.g., incident light) and generates an electric signal (e.g., generates the electric signal in response to receiving the light), may include a pixel array including a plurality of pixels, a circuit for driving the pixel array, etc. The image sensor may be widely applied to a smartphone, a tablet personal computer (PC), a laptop computer, a television (TV), etc., in addition to a camera for capturing pictures, videos, etc.

Recently, due to the size reduction of a portion pixel included in an image sensor, the complexity of metal interconnection in a pixel has increased.

SUMMARY

The inventive concepts provide image sensors having improved reliability. The image sensors may provide improved reliability based on having a reduced or eliminated resistor-capacitor (RC) delay that may be caused by a resistance and a parasitic capacitance of the metal interconnection in a pixel.

Objects of the inventive concepts are not limited to the foregoing, and other unmentioned objects would be apparent to one of ordinary skill in the art from the following description.

According to some example embodiments of the inventive concepts, an image sensor may include a substrate, a plurality of photoelectric transformation elements in the substrate, first conductive patterns on a first surface of the substrate, and second conductive patterns between the first conductive patterns and the first surface, in which any one of the first conductive patterns or the second conductive patterns includes a time constant adjustment pattern and neighboring conductive patterns in which the time constant adjustment pattern extends in a first direction that is parallel to the first surface and the neighboring conductive patterns extend in the first direction and are most adjacent to the time constant adjustment pattern, the time constant adjustment pattern includes one or more time constant adjustment portions that protrude in a second direction that is parallel to the first surface and is perpendicular to the first direction, and the one or more time constant adjustment portions do not overlap the neighboring conductive patterns in the second direction.

According to some example embodiments of the inventive concepts, an image sensor may include a substrate, a plurality of photoelectric transformation elements in the substrate, conductive patterns on a first surface of the substrate and extending in a first direction that is parallel to the first surface, and an interlayer insulation layer horizontally covering the conductive patterns, in which the conductive patterns include a time constant adjustment pattern and neighboring conductive patterns that are horizontally most adjacent to the time constant adjustment pattern, and the time constant adjustment pattern has a horizontal width that varies with arrangement of the neighboring conductive patterns.

According to some example embodiments of the inventive concepts, an image sensor may include a substrate, a plurality of photoelectric transformation elements in the substrate, conductive patterns on a first surface of the substrate and extending in a first direction that is parallel to the first surface, and an interlayer insulation layer horizontally covering the conductive patterns, in which the conductive patterns include a time constant adjustment pattern including a first edge extending in the first direction and a second edge being opposite to the first edge and extending in the first direction, first neighboring conductive patterns that are horizontally most adjacent to the time constant adjustment pattern and face the first edge, second neighboring conductive patterns that are horizontally most adjacent to the time constant adjustment pattern and face the second edge, and the time constant adjustment pattern includes a first time constant adjustment portion that protrudes from the first edge in a second direction that is parallel to the first surface and is perpendicular to the first direction and overlaps, in the second direction, a first part of the interlayer insulation layer interposed between the first neighboring conductive patterns.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
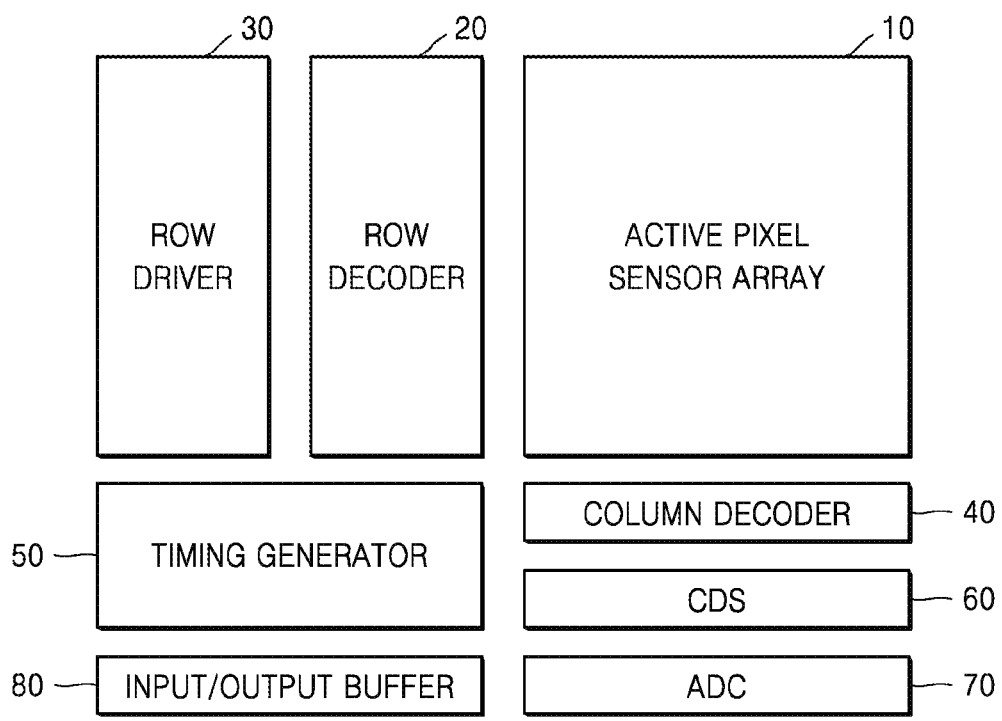
FIG. 1 is a block diagram of an image sensor according to some example embodiments of the inventive concepts.

Hereinafter, some example embodiments of the inventive concepts will be described in detail with reference to the accompanying drawings. Like components in the drawings will be referred to as like reference numerals, and will not be repeatedly described. In the following drawings, a thickness or size of each layer may be expressed exaggerated for convenience and clarity of description, and thus may be different from actual shape and ratio.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "linear," or the like with regard to other elements and/or properties thereof (e.g., structures, surfaces, directions, or the like) may be "perpendicular," "parallel," "linear," or the like or may be "substantially perpendicular," "substantially parallel," "substantially linear," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially linear" will be understood to be "linear" within manufacturing tolerances and/or material tolerances and/or have a deviation in magnitude and/or angle from "linear," or the like that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

It will be understood that elements, aspects, and/or properties thereof described herein as being "substantially" uniform and/or constant encompasses elements, aspects and/or properties thereof that have a relative variation in magnitude that is equal to or less than 10%. Further, regardless of whether elements and/or properties thereof are modified as "substantially," it will be understood that these elements, aspects, and/or properties thereof should be construed as including a manufacturing or operational tolerance (e.g., ±10%) around the stated elements, aspects, and/or properties thereof.

It will be understood that operations described herein as being "substantially" simultaneous with regard to each other encompasses operations occurring within 1 second of each other (e.g., within 0-0.9 seconds, within 0-0.5 seconds, 0-0.1 seconds, 0-0.01 seconds, 0-0.001 seconds, 0-0.0001 seconds, or the like).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a block diagram of an image sensor 100 according to some example embodiments of the inventive concepts.

Referring to FIG. 1, the image sensor 100 may include an active pixel sensor array 10, a row decoder 20, a row driver 30, a column decoder 40, a timing generator 50, a correlated double sampler 60, an analog-to-digital converter 70, and an input/output buffer 80.

The active pixel sensor array 10 may include a plurality of unit pixels arranged two-dimensionally. The active pixel sensor array 10 may convert an optical signal into an electric signal. The active pixel sensor array 10 may be driven by a plurality of driving signals such as a pixel selection signal, a reset signal, and a charge transmission signal of the row driver 30. The electric signal converted by the active pixel sensor array 10 may be provided to the correlated double sampler 60.

The row driver 30 may provide a plurality of driving signals for driving a plurality of unit pixels to the active pixel sensor array 10 based on a decoding result of the row decoder 20. When unit pixels included in the active pixel sensor array 10 are arranged in the form of a matrix, driving signals may be provided to each row.

The timing generator 50 may provide a timing signal and a control signal (e.g., a control signal of the image sensor 100) to the row decoder 20 and the column decoder 40.

The correlated double sampler 60 may receive, hold, and sample the electric signal generated in the active pixel sensor array 10. The correlated double sampler 60 may double-sample a specified noise level and a signal level based on an electric signal, thus outputting a differential level corresponding to a difference between a noise level and a signal level.

The analog-to-digital converter 70 may convert an analog signal corresponding to the differential level output from the correlated double sampler 60 into a digital signal and output the digital signal.

The input/output buffer 80 may latch the digital signal, and the latched signal may be sequentially output to an image signal processor according to a decoding result of the column decoder 40.

Some or all portions of the image sensor 100, including any of the portions thereof as shown in FIG. 1 (e.g., the active pixel sensor array 10, the row decoder 20, the row driver 30, the column decoder 40, the timing generator 50, the correlated double sampler 60, the analog-to-digital converter 70, and/or the input/output buffer 80) may be included in, include, and/or be implemented by an electronic device that includes one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of the image sensor 100, and/or any portions thereof, according to any of the example embodiments as described herein.

Figure 2:
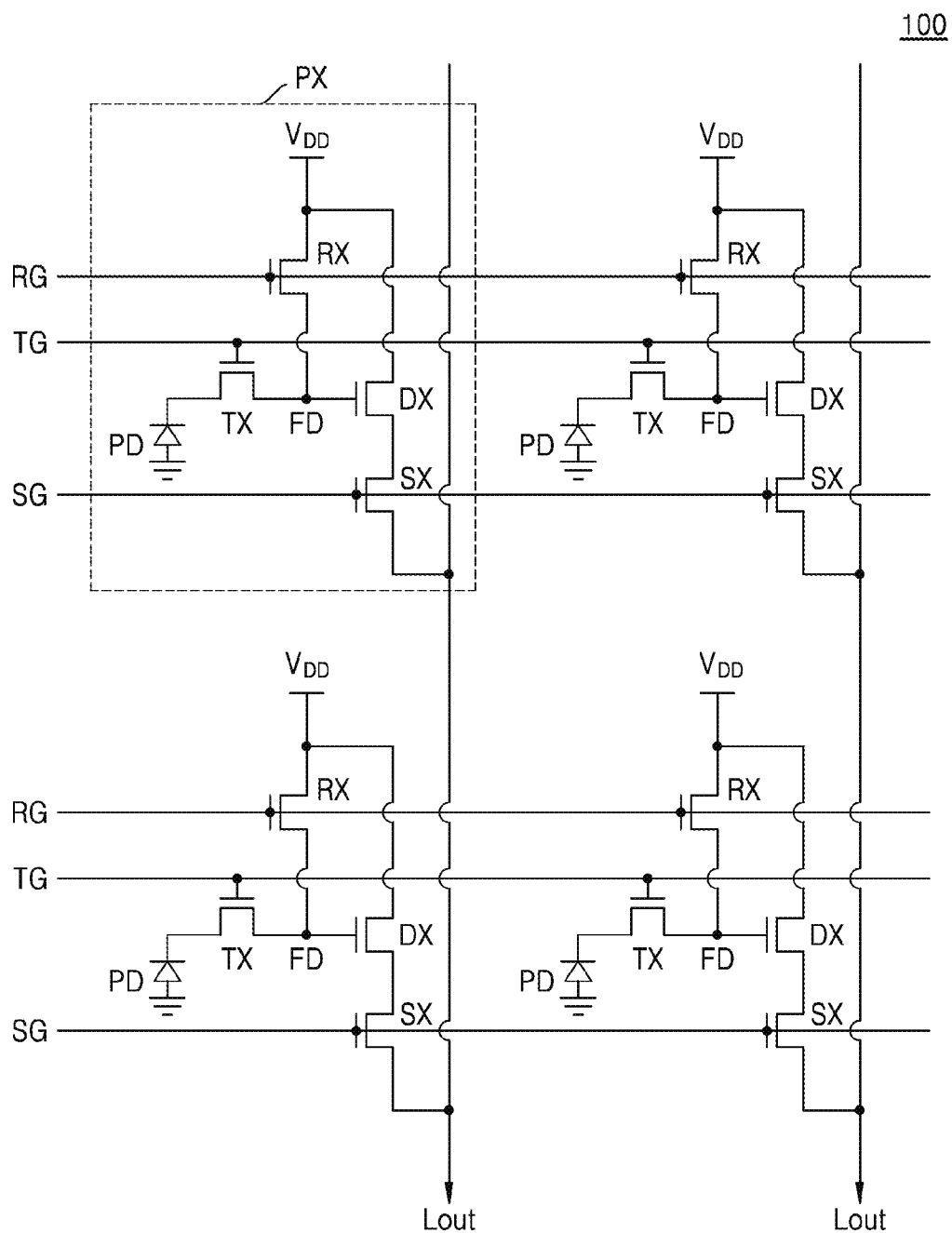
FIG. 2 is a circuit diagram for describing a unit pixel included in an image sensor, according to some example embodiments of the inventive concepts.

FIG. 2 is a circuit diagram for describing a unit pixel included in an image sensor, such as the image sensor 100 of FIG. 1, according to some example embodiments of the inventive concepts.

Referring to FIGS. 1 and 2, the active pixel sensor array 10 may include a plurality of unit pixels PX which may be arranged in the form of a matrix.

According to some example embodiments of the inventive concepts, the unit pixel PX may include a transmit transistor TX and logic transistors RX, SX, and DX. Herein, the logic transistors may include a reset transistor RX, a select transistor SX, and a drive transistor DX. The transmit transistor TX may include a transmit gate TG, a photoelectric transformation element PD, and a floating diffusion region FD.

The photoelectric transformation element PD may generate and accumulate photo charges in proportional to the amount of light incident from the outside. As the photoelectric transformation element PD, any one of a photo diode, a photo transistor, a photo gate, a pinned photo diode (PPD), and a combination thereof may be used. The transmit transistor TX may transmit charges accumulated in the photoelectric transformation element PD to the floating diffusion region FD. The photo charges generated in the photoelectric transformation element PD may be stored in the floating diffusion region FD. The drive transistor DX may be controlled by the amount of photo charges accumulated in the floating diffusion region FD.

The reset transistor RX may periodically reset the charges accumulated in the floating diffusion region FD. A drain electrode of the reset transistor RX may be connected with the floating diffusion region FD, and a source electrode of the reset transistor RX may be connected to a power voltage VDD. When the reset transistor RX is turned on, the power voltage VDD connected to the source electrode of the reset transistor RX may be provided to the floating diffusion region FD. Thus, when the reset transistor RX is turned on, the charges accumulated in the floating diffusion region FD may be discharged such that the floating diffusion region FD may be reset.

The drive transistor DX may constitute a source follower buffer amplifier together with a constant current source located outside the unit pixel PX, and amplify a potential change in the floating diffusion region FD, and output the amplified potential change to an output line Lout as an output signal.

The select transistor SX may select the unit pixels PX to be read row-by-row. When the select transistor SX is turned on, the power voltage VDD may be provided to the source electrode of the drive transistor DX. Signals conducted by any of the reset gate RG, transmit gate TG, and/or select gate SG of the respective transistors RX, TX, SX may be control signals of the image sensor 100.

Figure 3:
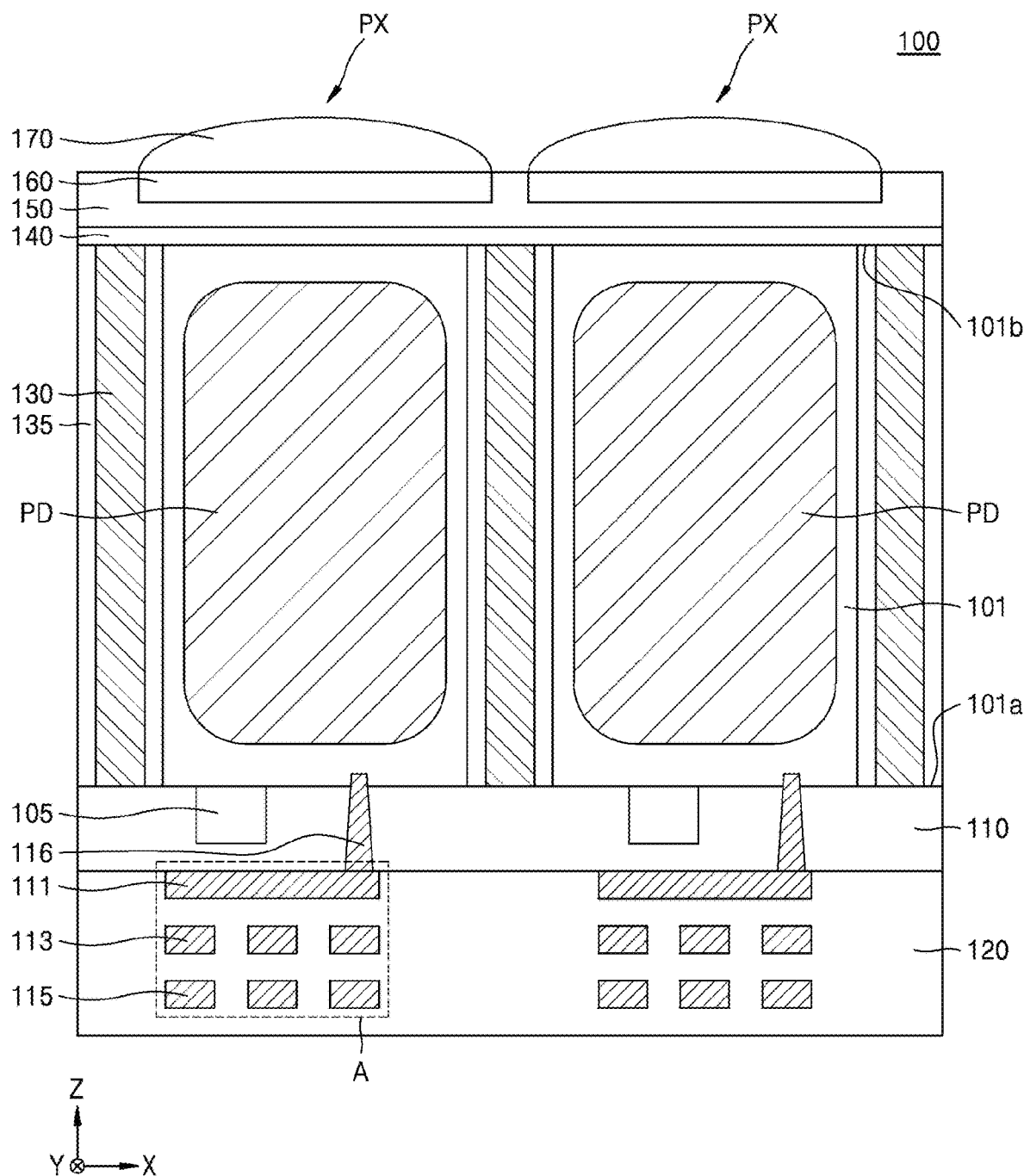
FIG. 3 is a cross-sectional view for describing an image sensor according to some example embodiments of the inventive concepts.

FIG. 3 is a block diagram of the image sensor 100 according to some example embodiments of the inventive concepts.

Referring to FIG. 3, the image sensor 100 may include a substrate 101, a photoelectric transformation element PD, a gate electrode 105, an insulation layer 110, a contact via 116, first through third conductive patterns 111, 113, and 115, an interlayer insulation layer 120, first and second element isolation layers 130 and 135, a passivation layer 140, a cover insulation layer 150, a color filter 160, and a micro lens 170.

The substrate 101 may include a first surface 101a and a second surface 101b which are opposed to each other. The first surface 101a of the substrate 101 may be a front surface of the substrate 101, and the second surface 101b of the substrate 101 may be a rear surface of the substrate 101.

Two directions that are substantially parallel to the first surface 101a and are substantially perpendicular to each other may be defined as a first direction and a second direction (an X direction and a Y direction), and a direction substantially perpendicular to the first surface 101a may be defined as a third direction (a Z direction).

In the substrate 101, a plurality of pixels PX may be formed. The pixels PX may be arranged in the form of a matrix in a plane view. Although not shown, a plurality of dummy pixels may be formed in the substrate 101. According to some example embodiments of the inventive concepts, the pixels PX may be arranged in a center of the matrix and the dummy pixels may be arranged in an edge of the matrix. According to some example embodiments of the inventive concepts, the first element isolation layer 130 may extend in the first and second directions (the X direction and the Y direction) between the pixels PX to horizontally separate adjacent pixels PX. According to some example embodiments of the inventive concepts, the second element isolation layer 135 may be arranged between the first element isolation layer 130 and the pixels PX.

The first element isolation layer 130 may include a material having superior gap fill capability, e.g., polysilicon (poly-Si). According to some example embodiments of the inventive concepts, the first element isolation layer 130 may be doped with, but not limited to, a P-type dopant, e.g., boron (B). According to some example embodiments of the inventive concepts, the first element isolation layer 130 may have a length in the third direction (the Z direction) that is substantially the same as the substrate 101 to separate the different pixels PX and dummy pixels.

The second element isolation layer 135 may include an insulation material. According to some example embodiments of the inventive concepts, the second element isolation layer 135 may include, but not limited to, a high-dielectric material (e.g., silicon dioxide).

Herein, the substrate 101 and the first element isolation layer 130 may operate electrodes, and the second element isolation layer 135 may operate as a dielectric layer to serve as a capacitor. Thus, a voltage difference between the substrate 101 and the first element isolation layer 130 may be held substantially constant.

According to some example embodiments of the inventive concepts, a specified potential may be applied to the substrate 101 through the contact via 116. According to some example embodiments of the inventive concepts, the potential of the substrate 101 may be, but not limited to, a ground potential. According to some example embodiments of the inventive concepts, a potential that is different from a potential applied to the substrate 101 may be applied to the first element isolation layer 130. According to some example embodiments of the inventive concepts, the first element isolation layer 130 includes doped polysilicon, and thus may have a potential that is substantially uniform over the entire first element isolation layer 130.

According to some example embodiments of the inventive concepts, by applying a voltage lower than that of the substrate 101 to the first element isolation layer 130, energy barrier between the first element isolation layer 130 and the substrate 101 may be increased, thus reducing dark current. Therefore, the reliability of the image sensor 100 may be enhanced.

According to some example embodiments of the inventive concepts, a photoelectric transformation element PD, e.g., a photo diode may be formed in the substrate 101, such that the photoelectric transformation element PD is partially or completely located in the Z-direction between the first and second surfaces 101a and 101b of the substrate 101. The gate electrodes 105 may be separated from each other on the first surface 101a of the substrate 101. The gate electrode 105 may be any one of, for example, a gate electrode of a charge transmit element, a gate electrode of a reset element, and a gate electrode of a drive element.

While the gate electrode 105 is illustrated as being arranged on the first surface 101a of the substrate 101 in FIG. 3, the technical spirit of the inventive concepts is not limited thereto. For example, the gate electrode 105 may be buried in the substrate 101.

The interlayer insulation layer 120 and the first through third conductive patterns 111, 113, and 115 may be arranged on (e.g., underneath or above) the first surface 101a of the substrate 101. The first through third conductive patterns 111, 113, and 115 may be covered with (e.g., partially or completely covered by, in the X, Y, and/or Z directions, for example horizontally covered by) the interlayer insulation layer 120. When the interlayer insulation layer 120 horizontally covers a given conductive patterns (e.g., the second conductive patterns), the interlayer insulation layer may be understood to cover the given conductive patterns in at least the X direction. The first through third conductive patterns 111, 113, and 115 may be protected and insulated by the interlayer insulation layer 120. In some example embodiments, any one of the second or third conductive patterns 113 or 115 may be referred to as first conductive patterns on the first surface 101a of the substrate 101, and any one of the first or second conductive patterns 111 and 113 may be referred to as second conductive patterns between (e.g., interposed between) the first conductive patterns and the first surface 101a. In some example embodiments, one of the first through third conductive patterns 111, 113, or 115 may be absent. In some example embodiments, the second conductive patterns 113 may be referred to as either first conductive patterns on the first surface 101a of the substrate 101 or second conductive patterns between (e.g., interposed between) first conductive patterns (e.g., third conductive patterns 115) and the first surface 101a.

The interlayer insulation layer 120 may include, for example, silicon oxide, silicon nitride, silicon oxynitride, and so forth. The first through third conductive patterns 111, 113, and 115 may include, for example, aluminum (Al), copper (Cu), tungsten (W), cobalt (Co), ruthenium (Ru), etc.

The first through third conductive patterns 111, 113, and 115 may include a plurality of wires stacked sequentially. In FIG. 3, the first through third conductive patterns 111, 113, and 115 are illustrated as including, but not limited to, three layers sequentially stacked. For example, conductive patterns of two layers or four or more layers may be formed in the interlayer insulation layer 120. According to some example embodiments of the inventive concepts, the first through third conductive patterns 111, 113, and 115 may have a time constant reduced in comparison to conventional art. Therefore, the response speed and reliability of the image sensor 100 may be improved.

A Z-direction distance between each of the second conductive patterns 113 and the first surface 101a of the substrate 101 may be greater than a Z-direction distance between each of the first conductive patterns 111 and the first surface 101a of the substrate 101. A Z-direction distance between each of the third conductive patterns 115 and the first surface 101a of the substrate 101 may be greater than the Z-direction distance between each of the second conductive patterns 113 and the first surface 101a of the substrate 101.

The first conductive patterns 111 may be patterns substantially simultaneously formed by metallization, in which a distance between each of the first conductive patterns 111 and the first surface 101a of the substrate 101 may be substantially identical. Likewise, the second conductive patterns 113 may be patterns substantially simultaneously formed by metallization, in which a distance between each of the second conductive patterns 113 and the first surface 101a of the substrate 101 may be substantially identical. The third conductive patterns 115 may be patterns substantially simultaneously formed by metallization, in which a distance between each of the third conductive patterns 115 and the first surface 101a of the substrate 101 may be substantially identical.

Although not shown, first conductive vias may be formed between the first conductive patterns 111 and the second conductive patterns 113 to electrically connect the first conductive patterns 111 to the second conductive patterns 113. The first conductive vias may be substantially simultaneously formed with the second conductive patterns 113 through dual damascene processing, without being limited thereto Likewise, second conductive vias may be formed between the second conductive patterns 113 and the third conductive patterns 115 to electrically connect the second conductive patterns 113 to the third conductive patterns 115. The second conductive vias may be substantially simultaneously formed with the third conductive patterns 115 through dual damascene processing, without being limited thereto.

The insulation layer 110 may be arranged between the first surface 101a and the interlayer insulation layer 120. The insulation layer 110 may cover the gate electrode 105 arranged on the first surface 101a of the substrate 101. According to some example embodiments of the inventive concepts, the insulation layer 110 may include an insulation material such as silicon oxide, silicon nitride, silicon oxynitride, etc.

The passivation layer 140 may be arranged on the second surface 101b of the substrate 101. According to some example embodiments of the inventive concepts, the passivation layer 140 may contact the second surface 101b of the substrate 101. According to some example embodiments of the inventive concepts, the passivation layer 140 may include, but not limited to, a high-dielectric amorphous material.

The color filter 160 and the cover insulation layer 150 that covers the color filter 160) may be formed on the passivation layer 140. The cover insulation layer 150 may include, for example, an oxide layer, a nitride layer, a low-dielectric material, resin, etc. According to some example embodiments of the inventive concepts, the cover insulation layer 150 may include a multi-layer structure.

The color filter 160 may be arranged on the passivation layer 140. The color filter 160 may be arranged on the second surface 101b of the substrate 101. The color filter 160 may pass light of a specified wavelength band therethrough such that adjacent pixels PX receive different lights.

The micro lens 170 may be arranged on the color filter 160. The micro lens 170 may include an organic material such as photosensitive resin, or an inorganic material. The micro lens 170 may collect incident light to the photoelectric transformation element PD.

Figure 4:
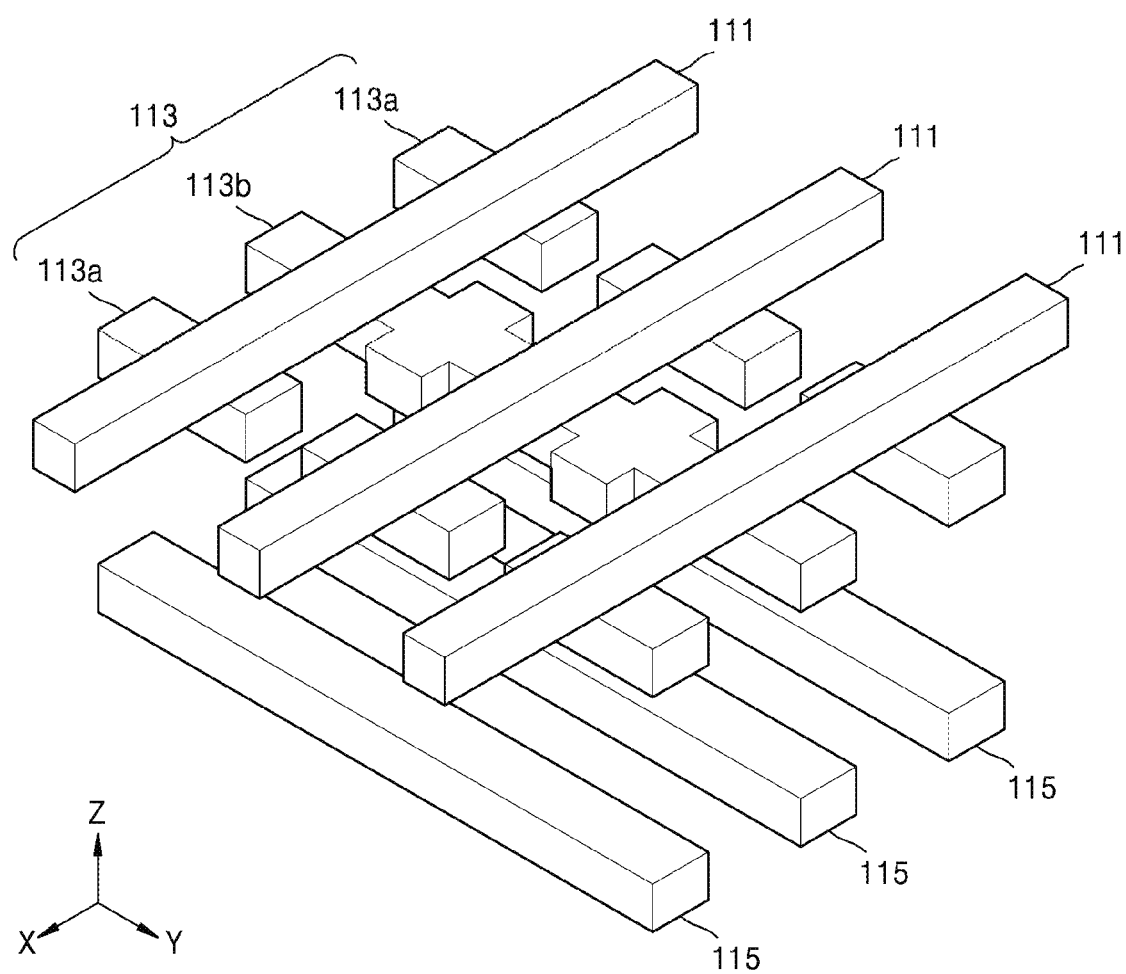
FIG. 4 is a perspective view for describing a structure of first through third conductive patterns included in the image sensor of FIG. 3.

FIG. 4 is a perspective view for describing a structure of the first through third conductive patterns 111, 113, and 115 included in the image sensor 100 of FIG. 3.

Figure 5:
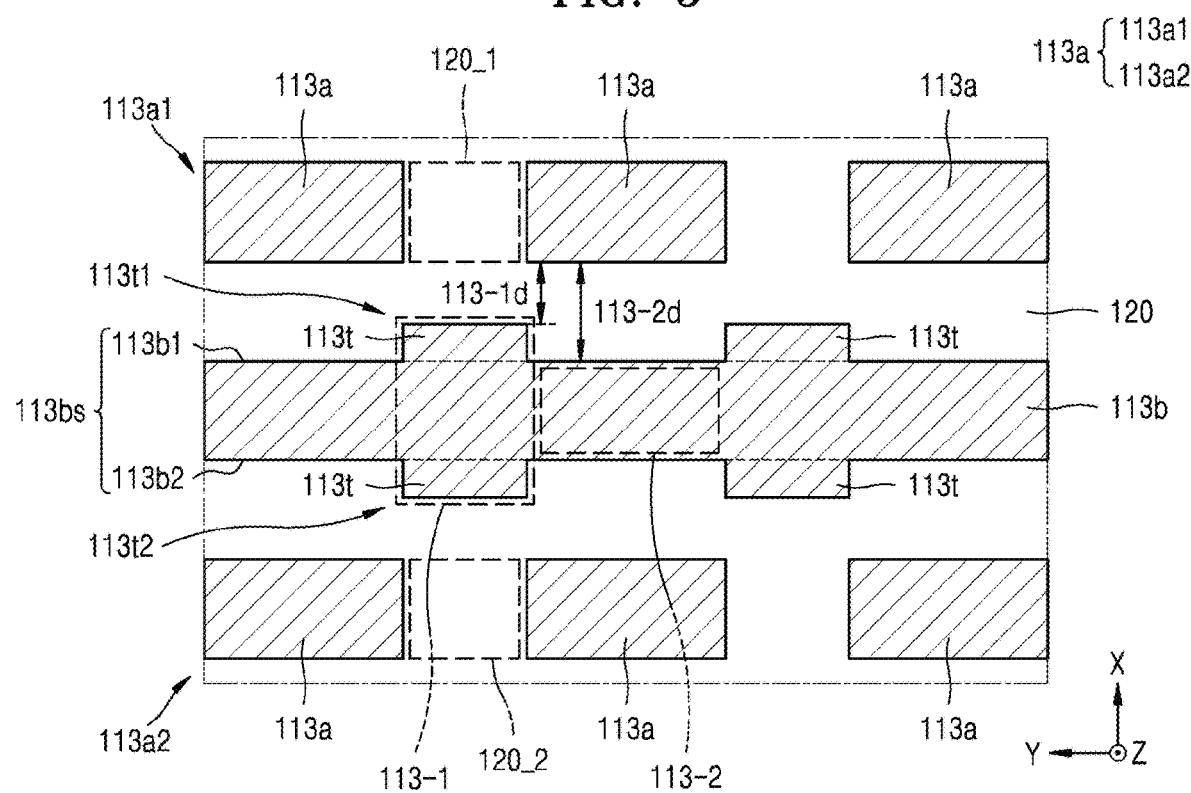
FIG. 5 is a plane view for describing second conductive patterns of FIG. 4.

FIG. 5 is a plane view for describing the second conductive patterns 113 of FIG. 4.

Referring to FIGS. 3 through 5, the first conductive patterns 111 may extend, for example, in the X direction (which may be parallel to the first surface 101a of the substrate 101), and the second and third conductive patterns 113 and 115 may extend, for example, in the Y direction (which may be parallel to the first surface 101a of the substrate 101 and may be perpendicular to the X direction). The second conductive patterns 113 (which may be referred to as any one of the first conductive patterns and/or the second conductive patterns) may include a time constant adjustment pattern 113b and neighboring conductive patterns 113a. The time constant adjustment patterns 113b may include time constant adjustment portions 113t. The time constant adjustment portions 113t may protrude horizontally outwardly from the center of the time constant adjustment pattern 113b. As shown in FIGS. 3-5, the time constant adjustment portions may be formed in (also referred to as protrude from in the X direction) opposite sides 113bs (e.g., which as shown in FIG. 5 may include opposite first and second edges 113b1 and 113b2) of the time constant adjustment pattern 113b. The time constant adjustment portions 113t may protrude in a direction (e.g., the Y direction) perpendicular to an extending direction (e.g., the X direction) of the time constant adjustment pattern 113b. As shown in FIGS. 3-5, the time constant adjustment pattern 113b may extend in a first direction that is parallel to the first surface 101a of the substrate 101 (e.g., the Y direction), and the neighboring conductive patterns 113a may extend in the same first direction (e.g., the Y direction) and may be most adjacent (e.g., horizontally most adjacent, or most adjacent in the X direction) to the time constant adjustment pattern 113b (e.g., may be adjacent to the time constant adjustment pattern 113b in the X direction and may be coplanar with the time constant adjustment pattern 113b in an XY plane). As shown, the time constant adjustment pattern 113b may include one or more time constant adjustment portions 113t that protrude in a second direction (e.g., the X direction) that is parallel to the first surface 101a and is perpendicular to the first direction.

The term "most adjacent" term with regard to a pattern may indicate that the "most adjacent" pattern is adjacent to a given pattern without any intervening patterns between the given pattern and the "most adjacent" pattern.

As shown in FIGS. 3-5, a distance in a third direction (e.g., the Z direction) perpendicular to the first surface 101a of the substrate 101 between the time constant adjustment pattern 113b and the first surface 101a of the substrate 101 may be the same (e.g., a same distance) as a distance in the third direction (e.g., Z direction) between each of the neighboring conductive patterns 113a and the first surface 101a.

As shown in at least FIG. 5, a width (e.g., in the X direction) of a first part 113-1 of the time constant adjustment pattern 113b (e.g., a first part that includes a time constant adjustment portion 113t) may be greater than a width (e.g., in the X direction) of a second part 113-2 of the time constant adjustment pattern 113b (e.g., a second part that does not include a time constant adjustment portion 113t). As further shown in at least FIG. 5, a distance 113-1d between the first part 113-1 and a first neighboring conductive pattern 113a that is any one of the neighboring conductive patterns 113a is greater than a distance 113-2d between the second part 113-2 and the first neighboring conductive pattern 113a.

It may be understood that, as shown in FIG. 5, the time constant adjustment pattern 113b includes a first edge 113b1 extending in the Y direction and a second edge 113b2 that is opposite to the first edges 113b1 and extends in the Y direction, and that the neighboring conducting patterns 113a include first neighboring conductive patterns 113a1 that are most adjacent in the X direction (e.g., horizontally) to the time constant adjustment pattern 113b and face the first edge 113b1, and that the neighboring conducting patterns 113a include second neighboring conductive patterns 113a2 that are most adjacent in the X direction (e.g., horizontally) to the time constant adjustment pattern 113b and face the second edge 113b2.

Figure 7:
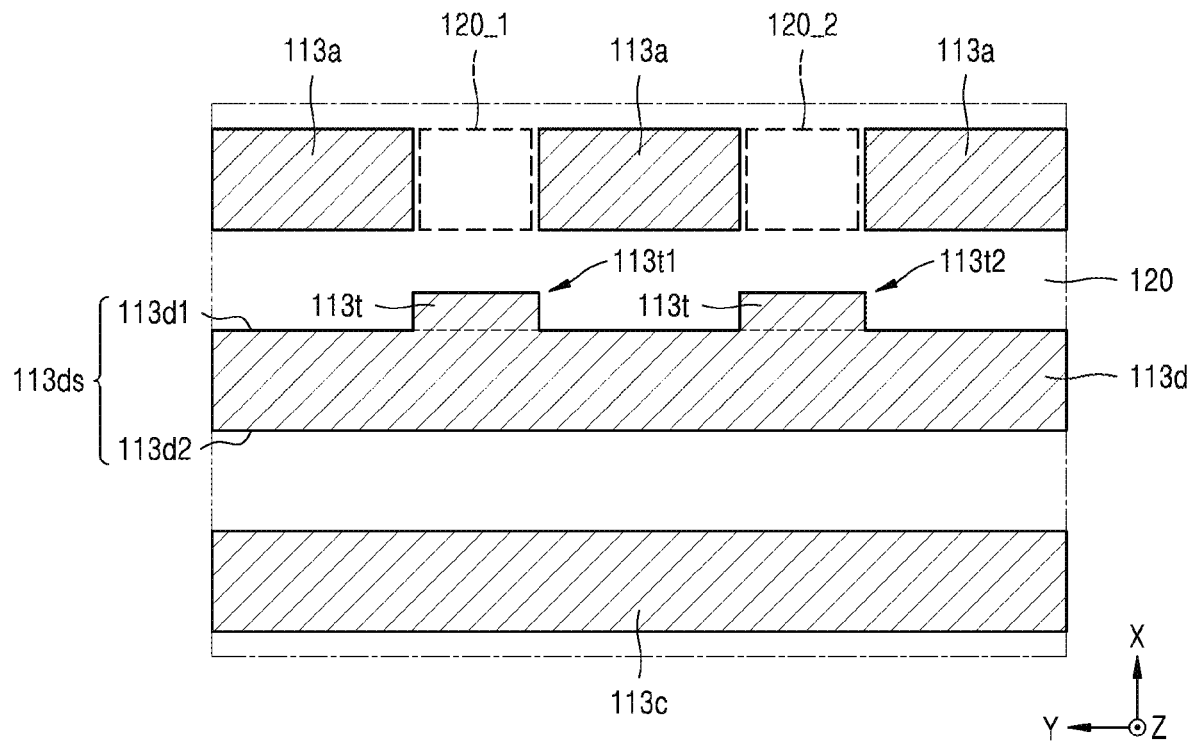
FIG. 7 is a plane view for describing second conductive patterns and a time constant adjustment pattern, according to some example embodiments of the inventive concepts.
Figure 8:
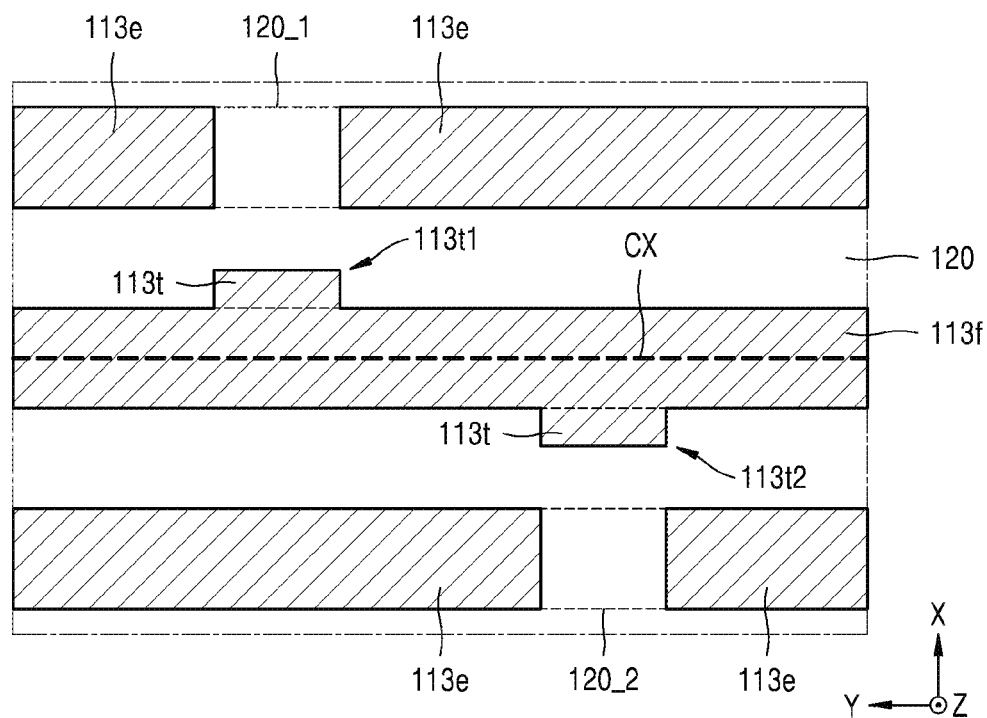
FIG. 8 is a plane view for describing second conductive patterns and a time constant adjustment pattern, according to some example embodiments of the inventive concepts.

As shown in FIG. 5, the time constant adjustment portions 113t include a first time constant adjustment portion 113t1 that protrudes from the first edge 113b1 in the X direction and overlaps, in the X direction, a first part 120_1 of the interlayer insulation layer 120 that is interposed between the first neighboring conductive patterns 113a1. As shown in FIG. 5, the time constant adjustment portions 113t includes a second time constant adjustment portion 113t2 that protrudes from the first edge 113b1 or the second edge 113b2 in the X direction and overlaps, in the X direction, a second part 120_2 of the interlayer insulation layer 120 interposed between the first neighboring conductive patterns 113a1 or the second neighboring conductive patterns 113a2. As shown in FIGS. 7 and 8, the first time constant adjustment portion 113t1 may not overlap the second time constant adjustment portion 113t2 in the X direction. As shown in FIG. 5, the first time constant adjustment portion 113t1 may overlap the second time constant adjustment portion 113t2 in the X direction. As shown in FIG. 8, the first time constant adjustment portion 113t0 may not overlap the second time constant adjustment portion 113t2 in the Y direction or the X direction.

As shown in at least FIG. 7, a second edge 113d2 of the time constant adjustment pattern 113d (which has opposite sides 113ds including the opposite first and second edges 113d1 and 113d2) may be linear.

The time constant adjustment pattern 113b may have a resistance reduced in comparison to other patterns having the same length, as will be described later with reference to FIG. 6. The time constant adjustment pattern 113b may be a metal line extending relatively long, like a control signal line, a signal output line, etc. The image sensor 100 may be configured to apply at least one of a control signal of the image sensor 100 and/or an output signal of the image sensor 100 to the time constant adjustment pattern 113b. Accordingly, it will be understood that the time constant adjustment pattern 113b may be configured to receive and/or conduct at least one of a control signal of the image sensor 100 or an output signal of the image sensor 100.

The time constant adjustment pattern 113b may have a shape determined based on neighboring conductive patterns 113a. Herein, the neighboring conductive patterns 113a may be arranged at the same level as the time constant adjustment pattern 113b, such that the neighboring, and may be most adjacent to the time constant adjustment pattern 113b. The neighboring conductive patterns 113a may directly face the time constant adjustment pattern 113b. Thus, between the neighboring conductive patterns 113a and the time constant adjustment pattern 113b, the interlayer insulation layer 120 may be interposed without the second conductive patterns 113 being additionally interposed.

The positions of the time constant adjustment portions 113t may be determined according to the positions of the neighboring conductive patterns 113a. Thus, the time constant adjustment pattern 113b may have an X-direction width (e.g., a horizontal width) that varies (e.g., in the Y direction) with the positions (e.g., arrangement) of the neighboring conductive patterns 113a (e.g., the arrangement of the neighboring conductive patterns 113a in the Y direction). According to some example embodiments of the inventive concepts, the time constant adjustment portions 113t may not horizontally (i.e., in the X direction) overlap the neighboring conductive patterns 113a that are most adjacent to the time constant adjustment pattern 113b. Restated, in some example embodiments, the time constant adjustment portions 113t may not overlap any of the most-adjacent neighboring conductive patterns 113a at all in the X direction. Further restated, the time constant adjustment portions 113t may be understood to be arranged alternately with the neighboring conductive patterns 113a in the Y direction and protrude in the X direction that is parallel to the first surface 101a of the substrate 101 and is perpendicular to the Y direction. According to some example embodiments of the inventive concepts, the time constant adjustment portions 113t may not face the most adjacent neighboring conductive patterns 113a. According to some example embodiments of the inventive concepts, the time constant adjustment portions 113t may face the interlayer insulation layer 120 interposed between the most adjacent neighboring conductive patterns 113a.

According to some example embodiments of the inventive concepts, the time constant adjustment portions 113t may not vertically (i.e., in the Z direction) overlap the first conductive patterns 111 and the third conductive patterns 115 that are most adjacent to the time constant adjustment pattern 113b. For example, the time constant adjustment portions 113t may not overlap any of the first conductive patterns 111 and the third conductive patterns 115 that are most adjacent to the time constant adjustment pattern 113b in the Z direction at all. In FIG. 5, the time constant adjustment portions 113t are illustrated as having an approximately rectangular plane shape, but this illustration is merely for an example and does not limit the technical spirit of the inventive concepts in any sense. For example, the time constant adjustment portions 113t may have a rectangular plane shape including at least one round corner.

According to some example embodiments of the inventive concepts, the time constant adjustment pattern 113b may include the time constant adjustment portion 113t protruding from the center, thus having a relatively increasing cross-sectional area and a reduced resistance. A resistance per unit length (e.g., resistance per length) in a Y-direction length of the time constant adjustment pattern 113b (which may be understood to be a ratio of resistivity of the time constant adjustment pattern 113b to the XZ cross-sectional area of the time constant adjustment pattern 113b) may be lower than a resistance per unit length in an Y-direction length of the neighboring conductive patterns 113a. Restated, a resistance per length of the time constant adjustment pattern 113b in the Y direction may be less (e.g., smaller) than a resistance per length in the Y direction of each of the neighboring conductive patterns 113a.

The time constant adjustment portion 113t does not vertically and horizontally overlap adjacent conductive patterns among the first through third conductive patterns 111, 113, and 115, such that a parasitic capacitance between the time constant adjustment portion 113t and the conductive patterns 111, 113, and 115 adjacent thereto may be low. Thus, a total resistance of the first through third conductive patterns 111, 113, and 115 may be reduced, thereby improving the reliability of the image sensor 100 (see FIG. 3). Furthermore, by reducing a time constant without increasing a width of a horizontally extending conductive pattern, the degree of freedom of designing may be enhanced.

Although it is illustrated in FIGS. 4 and 5 that the second conductive patterns 113 that are second farthest from the first surface 101a of the substrate 101 include the time constant adjustment pattern 113b, this is merely for convenience of a description and does not limit the technical spirit of the inventive concepts in any sense. For example, the first conductive patterns 111 and the third conductive patterns 115 may include a time constant adjustment pattern. Hence, based on the description provided herein, those of ordinary skill in the art may easily reach embodiments of the inventive concepts where the first conductive patterns 111 and the third conductive patterns 115 include a time constant adjustment pattern.

Figure 6:
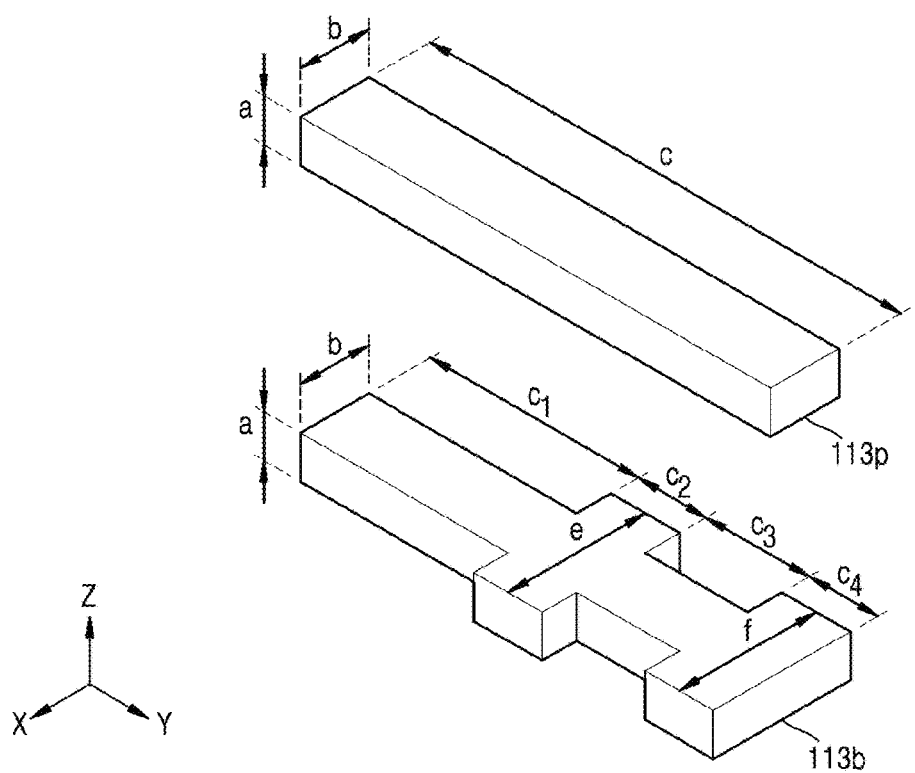
FIG. 6 is a view for describing an effect of an image sensor, according to some example embodiments of the inventive concepts.

FIG. 6 is a view for describing an effect of an image sensor, according to some example embodiments of the inventive concepts.

More specifically, FIG. 6 illustrates a comparison pattern 113p where a time constant adjustment portion is not formed and the time constant adjustment pattern 113b having a length that is substantially the same as the comparison pattern 113p.

Referring to FIG. 6, a resistance Rp of the comparison pattern 113p may be given by Equation 1.

$$Rp = \rho \frac{c}{a \cdot b} = \rho \frac{c_1 + c_2 + c_3 + c_4}{a \cdot b} \quad \text{[Equation 1]}$$

A resistance Rt of the time constant adjustment pattern 113b may be given by Equation 2.

$$Rt = \rho \left( \frac{c_1}{a \cdot b} + \frac{c_2}{a \cdot e} + \frac{c_3}{a \cdot b} + \frac{c_4}{a \cdot f} \right) \quad \text{[Equation 2]}$$

Thus, a resistance difference between two patterns may be given by Equation 3.

In Equation 1 and Equation 2, $c=c_1+c_2+c_3+c_4$, a, b, c, $c_1$, $c_2$, $c_3$, $c_4$, e, and f indicate geometrical dimensions indicated in the drawing, and ρ indicates a resistivity of a conductive material constituting the comparison pattern 113p and the time constant adjustment pattern 113b.

$$\Delta = Rp - Rt \quad \text{[Equation 3]}$$
$$= \rho \frac{c_1 + c_2 + c_3 + c_4}{a \cdot b} -$$
$$\rho \left( \frac{c_1}{a \cdot b} + \frac{c_2}{a \cdot e} + \frac{c_3}{a \cdot b} + \frac{c_4}{a \cdot f} \right)$$
$$= \frac{\rho c_2}{a} \left( \frac{1}{b} - \frac{1}{e} \right) + \frac{\rho c_4}{a} \left( \frac{1}{b} - \frac{1}{f} \right)$$
$$= \frac{\rho c_2}{a} \left( \frac{e - b}{be} \right) + \frac{\rho c_4}{a} \left( \frac{f - b}{bf} \right)$$

The neighboring conductive patterns 113a shown in FIGS. 4 and 5 also have a structure that is similar to the comparison pattern 113p of FIG. 6, such that the time constant adjustment pattern 113b has a resistance per unit length reduced in comparison to the neighboring conductive patterns 113a.

In metallization for forming a conductive pattern, it may not be desirable to increase a value a corresponding to a height of the pattern to reduce the resistance of the conductive pattern because such an increase may increase the dimensions of the image sensor. Hence, by adjusting a width (the X-direction width) of the pattern, a resistance of the time constant adjustment pattern 113b may be reduced and thus a time constant of the entire conductive patterns may be improved.

FIG. 7 is a plane view for describing neighboring conductive patterns 113a and 113c and a time constant adjustment pattern 113d, according to some example embodiments of the inventive concepts, which corresponds to FIG. 5.

For convenience of description, description redundant to the description made with reference to FIGS. 4 through 6 will be omitted and a difference will be described mainly.

Referring to FIG. 7, the neighboring conductive patterns 113a arranged in a side of the time constant adjustment pattern 113d may be substantially the same as those illustrated in FIG. 5. The neighboring conductive pattern 113c arranged in another side of the time constant adjustment pattern 113d may extend in parallel to and continuously to the time constant adjustment pattern 113d.

Hence, the time constant adjustment pattern 113d may horizontally (e.g., in the Y direction) overlap the neighboring conductive pattern 113c over the entire length of the time constant adjustment pattern 113d, such that the time constant adjustment pattern 113d may include the time constant adjustment portions 113t formed in (e.g., protruding from in the X direction) a side (i.e., a side and/or edge facing the neighboring conductive pattern 113a) of the time constant adjustment pattern 113d. As shown in FIG. 7, the time constant adjustment pattern 113d may include the time constant adjustment portions 113t formed in (e.g., protruding from in the X direction) a single side 113ds (e.g., single edge 113d1 or edge 113d2 facing the neighboring conductive pattern 113a), and not both opposite sides or side surfaces, of the time constant adjustment pattern 113d.

FIG. 8 is a plane view for describing neighboring conductive patterns 113e and a time constant adjustment pattern 113f, according to some example embodiments of the inventive concepts, which corresponds to FIG. 5.

For convenience of description, description redundant to the description made with reference to FIGS. 4 through 6 will be omitted and a difference will be described mainly.

Referring to FIG. 8, one of the neighboring conductive patterns 113e arranged in a side of (e.g., arranged to a side of in the X direction) the time constant adjustment pattern 113f may be different from another neighboring conductive pattern 113e arranged in another side. For example, a part 120_1 of the interlayer insulation layer 120 interposed between the neighboring conductive patterns 113e arranged in a side of the time constant adjustment pattern 113f may not overlap, in the Y direction, a part 120_2 of the interlayer insulation layer 120 interposed between the neighboring conductive patterns 113e arranged in another side of the time constant adjustment pattern 113f.

Hence, the time constant adjustment pattern 113f may have an asymmetric shape with respect to a central axis CX in the X direction. For example, the time constant adjustment portion 113t arranged in a side of the time constant adjustment pattern 113f may not overlap, in the Y direction, the time constant adjustment portion 113t arranged in another side of the time constant adjustment pattern 113d As shown in FIG. 8, the time constant adjustment portions 113t are arranged alternately with the neighboring conductive patterns 113e in the Y direction and protrude in the X direction, and the time constant adjustment portions 113t each face, in the second direction, a part (e.g., 1120_1 or 120_2) of the interlayer insulation layer 120 that is interposed between the neighboring conductive patterns 113e arranged in the Y direction.

Figure 9:
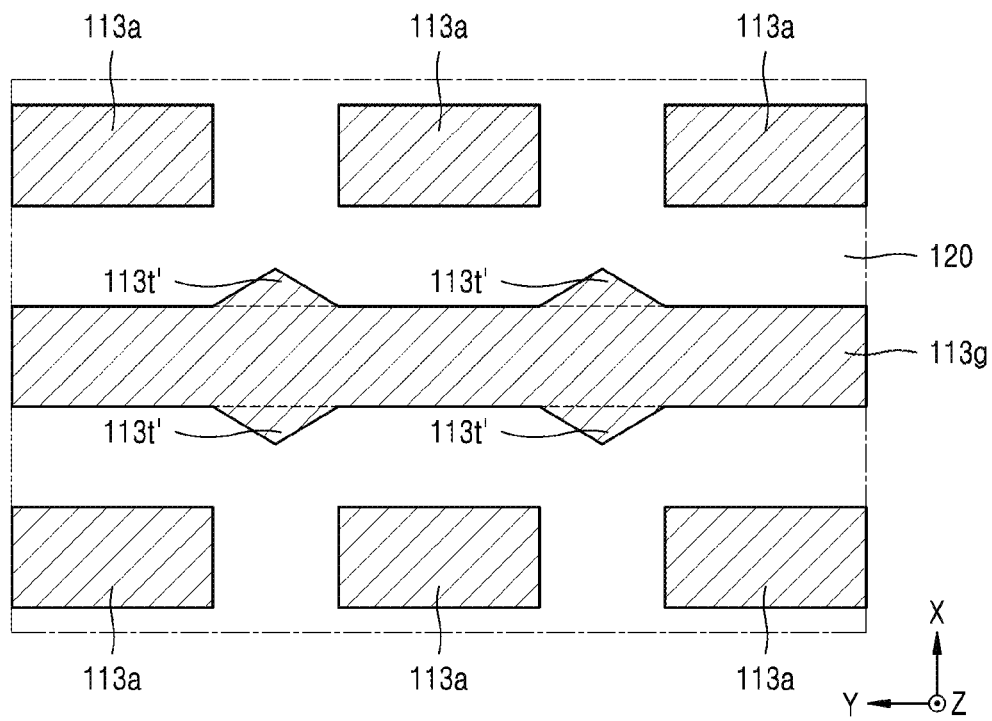
FIG. 9 is a plane view for describing a time constant adjustment pattern, according to some example embodiments of the inventive concepts.

FIG. 9 is a plane view for describing a time constant adjustment pattern 113g, according to some example embodiments of the inventive concepts, which corresponds to FIG. 5.

For convenience of description, description redundant to the description made with reference to FIGS. 4 through 6 will be omitted and a difference will be described mainly.

Referring to FIG. 9, the time constant adjustment pattern 113g may include a time constant adjustment portion 113t' having a shape that is different from that of the time constant adjustment pattern 113b of FIG. 5. According to some example embodiments of the inventive concepts, the time constant adjustment portion 113t' may have an approximately triangular plane shape. Thus, a capacitance between the neighboring conductive patterns 113a that are most adjacent horizontally and the time constant adjustment pattern 113g may be reduced.

Figure 10:
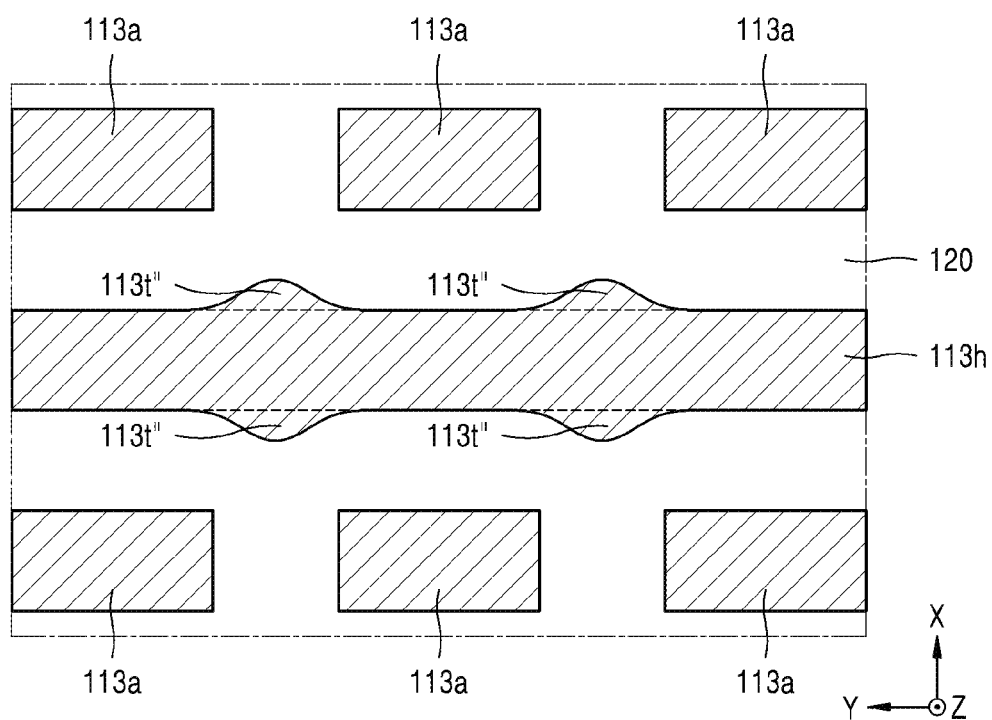
FIG. 10 is a plane view for describing a time constant adjustment pattern, according to some example embodiments of the inventive concepts.

FIG. 10 is a plane view for describing a time constant adjustment pattern 113h, according to some example embodiments of the inventive concepts, which corresponds to FIG. 5.

For convenience of description, description redundant to the description made with reference to FIGS. 4 through 6 will be omitted and a difference will be described mainly.

Referring to FIG. 10, the time constant adjustment pattern 113h may include a time constant adjustment portion 113t'' having a curved profile unlike the time constant adjustment pattern 113b of FIG. 5. According to some example embodiments of the inventive concepts, the profile of the time constant adjustment portion 113t'' may be designed to have optimal resistance and capacitance to minimize a time constant of the time constant adjustment pattern 113h.

Figure 11:
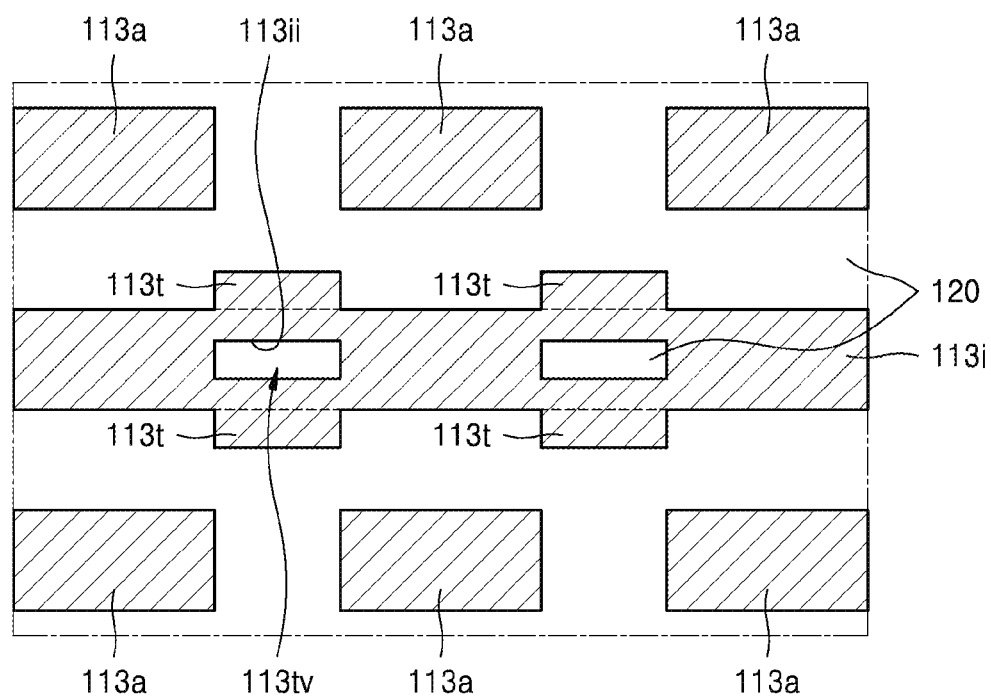
FIG. 11 is a plane view for describing a time constant adjustment pattern, according to some example embodiments of the inventive concepts.

FIG. 11 is a plane view for describing a time constant adjustment pattern 113i, according to some example embodiments of the inventive concepts, which corresponds to FIG. 5.

For convenience of description, description redundant to the description made with reference to FIGS. 4 through 6 will be omitted and a difference will be described mainly.

Referring to FIG. 11, the time constant adjustment pattern 113i may have a shape that is similar to that of the time constant adjustment pattern 113b of FIG. 5 and may further include (e.g., have one or more inner surfaces 113ii that define) a time constant adjustment void 113tv within the time constant adjustment pattern 113i and which overlaps the time constant adjustment portion 113t in the X direction. The time constant adjustment void 113tv may include a structure that the interlayer insulation layer 120 fills a part in which a conductive material constituting the time constant adjustment pattern 113i is removed. Restated, for example, the one or more inner surfaces 113ii of the time constant adjustment pattern 113i may define a time constant adjustment void 113tv within the time constant adjustment pattern 113i and which is at least partially (e.g., partially or completely) filled by at least a portion of the interlayer insulation layer 120. Thus, a capacitance based on the time constant adjustment portion 113t of a part overlapping the first through third conductive patterns 111 and 115 in the Z direction may be reduced, thereby improving the reliability of the image sensor 100 (see FIG. 3). The time constant adjustment void 113tv may overlap at least one of the first conductive patterns 111 and/or the third conductive patterns 115 in the Z direction.

Although the time constant adjustment void 113tv is illustrated as having a rectangular plane shape in FIG. 11, it may have a random shape for implementing a set time constant, such as a circular shape, an oval shape, a polygonal shape, etc.

Figure 12:
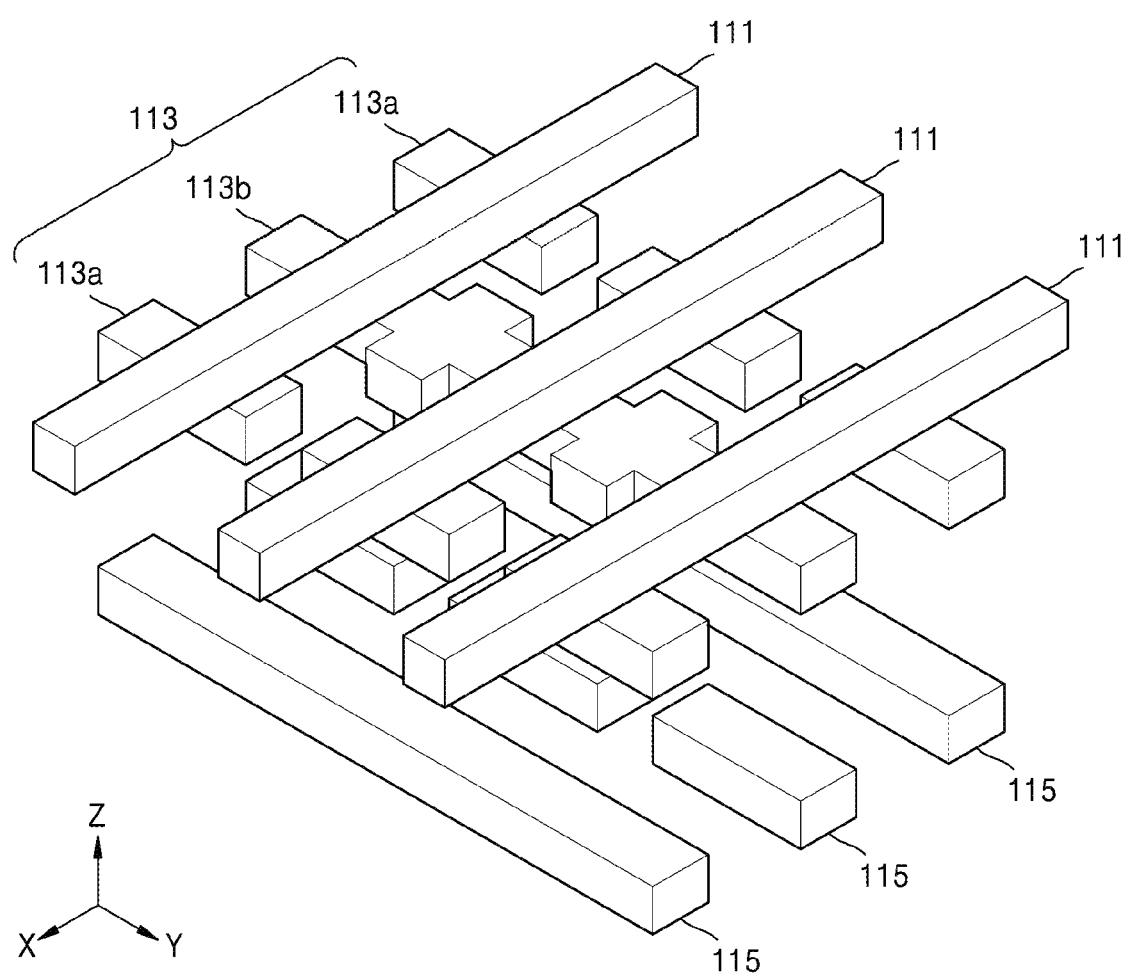
FIG. 12 is a perspective view for describing a structure of first through third conductive patterns included in an image sensor.

FIG. 12 is a perspective view for describing a structure of first through third conductive patterns 111, 113, and 115 included in the image sensor (100?).

For convenience of description, description redundant to the description made with reference to FIGS. 4 through 6 will be omitted and a difference will be described mainly.

Referring to FIGS. 5 and 12, unlike in FIG. 4, the third conductive pattern 115 overlapping the time constant adjustment pattern 113b in the Z direction may extend discontinuously. As a result, the time constant adjustment portion 113t of the time constant adjustment pattern 113b faces the interlayer insulation layer 120, such that the total capacitance of the first through third conductive patterns 111, 113, and 115 may be reduced.

Figure 13:
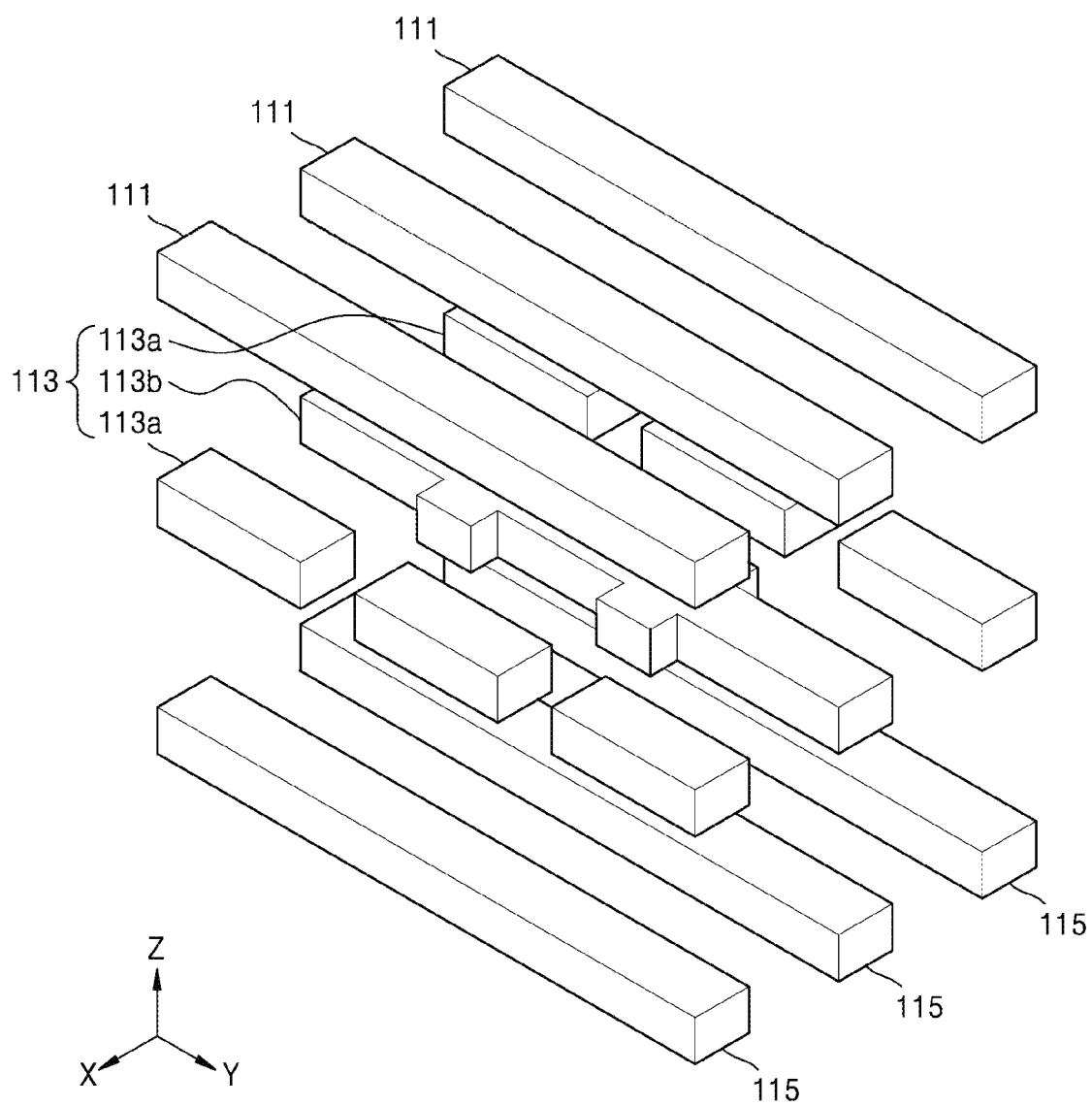
FIG. 13 is a perspective view for describing a structure of first through third conductive patterns included in an image sensor.

FIG. 13 is a perspective view for describing a structure of first through third conductive patterns included in an image sensor.

For convenience of description, description redundant to the description made with reference to FIGS. 4 through 6 will be omitted and a difference will be described mainly.

Referring to FIGS. 5 through 13, unlike in FIG. 4, the first through third conductive patterns 111, 113, and 115 may extend in the Y direction. According to some example embodiments of the inventive concepts, the time constant adjustment pattern 113b may overlap any one of the first through third conductive patterns 111 and 115 in the Z direction, but the time constant adjustment portion 113t may not overlap the first and third conductive patterns 111 and 115 in the Z direction.

While the inventive concepts have been particularly shown and described with reference to some example embodiments thereof, it will be understood that various changes in form and details may be made therein without departing from the spirit and scope of the following claims.

What is claimed is:

1. An image sensor, comprising:
   a substrate;
   a photoelectric transformation element in the substrate;
   first conductive patterns on a first surface of the substrate; and
   second conductive patterns between the first conductive patterns and the first surface,
   wherein any one of the first conductive patterns or the second conductive patterns includes a time constant adjustment pattern and neighboring conductive patterns, wherein the time constant adjustment pattern extends in a first direction that is parallel to the first surface and the neighboring conductive patterns extend in the first direction and are most adjacent to the time constant adjustment pattern,
   the time constant adjustment pattern includes one or more time constant adjustment portions that protrude in a second direction that is parallel to the first surface and is perpendicular to the first direction, and
   the one or more time constant adjustment portions do not overlap the neighboring conductive patterns in the second direction.

2. The image sensor of claim 1, wherein a distance in a third direction perpendicular to the first surface between the time constant adjustment pattern and the first surface is a same distance as a distance in the third direction between each of the neighboring conductive patterns and the first surface.

3. The image sensor of claim 1, wherein
   the time constant adjustment pattern and the neighboring conductive patterns are included in the first conductive patterns, and
   the one or more time constant adjustment portions do not overlap the second conductive patterns in a third direction that is perpendicular to the first surface.

4. The image sensor of claim 1, wherein the one or more time constant adjustment portions protrude from opposite sides of the time constant adjustment pattern in the second direction.

5. The image sensor of claim 1, wherein the one or more time constant adjustment portions protrude from a side of the time constant adjustment pattern in the second direction.

6. The image sensor of claim 1, wherein
   the time constant adjustment pattern and the neighboring conductive patterns are included in the first conductive patterns, and
   the time constant adjustment pattern further includes one or more inner surfaces that define a time constant adjustment void that overlaps the one or more time constant adjustment portions in the second direction and overlaps any one of the second conductive patterns in a third direction that is perpendicular to the first surface.

7. The image sensor of claim 6, further comprising:
an interlayer insulation layer covering the first conductive patterns and the second conductive patterns,
wherein the interlayer insulation layer at least partially fills the time constant adjustment void.

8. The image sensor of claim 1, wherein the image sensor is configured to apply any one of a control signal of the image sensor or an output signal of the image sensor to the time constant adjustment pattern.

9. The image sensor of claim 1, wherein a resistance per length of the time constant adjustment pattern in the first direction is less than a resistance per length of each of the neighboring conductive patterns in the first direction.

10. An image sensor, comprising:
a substrate;
a plurality of photoelectric transformation elements in the substrate;
conductive patterns on a first surface of the substrate and extending in a first direction that is parallel to the first surface; and
an interlayer insulation layer horizontally covering the conductive patterns,
wherein the conductive patterns include a time constant adjustment pattern and neighboring conductive patterns that are horizontally most adjacent to the time constant adjustment pattern, and
wherein the time constant adjustment pattern has a horizontal width that varies with an arrangement of the neighboring conductive patterns.

11. The image sensor of claim 10, wherein a resistance per length of the time constant adjustment pattern in the first direction is less than a resistance per length of each of the neighboring conductive patterns in the first direction.

12. The image sensor of claim 10, wherein the time constant adjustment pattern includes one or more time constant adjustment portions that are arranged alternately with the neighboring conductive patterns in the first direction and protrude in a second direction that is parallel to the first surface and is perpendicular to the first direction.

13. The image sensor of claim 12, wherein the one or more time constant adjustment portions face, in the second direction, a part of the interlayer insulation layer that is interposed between the neighboring conductive patterns arranged in the first direction.

14. The image sensor of claim 10, wherein
a width of a first part of the time constant adjustment pattern is greater than a width of a second part of the time constant adjustment pattern, and
a distance between the first part and a first neighboring conductive pattern that is any one of the neighboring conductive patterns is greater than a distance between the second part and the first neighboring conductive pattern.

15. An image sensor, comprising:
a substrate;
a plurality of photoelectric transformation elements in the substrate;
conductive patterns on a first surface of the substrate and extending in a first direction that is parallel to the first surface; and
an interlayer insulation layer horizontally covering the conductive patterns,
wherein the conductive patterns include
a time constant adjustment pattern including a first edge extending in the first direction and a second edge being opposite to the first edge and extending in the first direction,
first neighboring conductive patterns that are horizontally most adjacent to the time constant adjustment pattern and face the first edge, and
second neighboring conductive patterns that are horizontally most adjacent to the time constant adjustment pattern and face the second edge, and
wherein the time constant adjustment pattern includes a first time constant adjustment portion that protrudes from the first edge in a second direction that is parallel to the first surface and is perpendicular to the first direction and overlaps, in the second direction, a first part of the interlayer insulation layer interposed between the first neighboring conductive patterns.

16. The image sensor of claim 15, wherein the time constant adjustment pattern includes a second time constant adjustment portion that protrudes in the second direction and overlaps, in the second direction, a second part of the interlayer insulation layer interposed between the first neighboring conductive patterns or the second neighboring conductive patterns.

17. The image sensor of claim 16, wherein the first time constant adjustment portion does not overlap the second time constant adjustment portion in the second direction.

18. The image sensor of claim 16, wherein the first time constant adjustment portion and the second time constant adjustment portion overlap each other in the second direction.

19. The image sensor of claim 16, wherein a resistance per length of the time constant adjustment pattern in the first direction is less than a resistance per length of each of the first and second neighboring conductive patterns in the first direction.

20. The image sensor of claim 15, wherein the second edge is linear.

* * * * *